US006822318B2

(12) United States Patent
Honer et al.

(10) Patent No.: US 6,822,318 B2
(45) Date of Patent: Nov. 23, 2004

(54) STRESS ISOLATING DIE ATTACH STRUCTURE AND METHOD

(75) Inventors: Kenneth A. Honer, Santa Clara, CA (US); Daniel Parker, Palo Alto, CA (US)

(73) Assignee: LightConnect, Inc., Newark, CA (US)

( * ) Notice: Subject to any disclaimer, the term of this patent is extended or adjusted under 35 U.S.C. 154(b) by 0 days.

(21) Appl. No.: 10/146,454

(22) Filed: May 14, 2002

(65) Prior Publication Data

US 2002/0185715 A1 Dec. 12, 2002

Related U.S. Application Data

(60) Provisional application No. 60/290,913, filed on May 14, 2001.

(51) Int. Cl.[7] .............................................. H01L 21/44
(52) U.S. Cl. ...................... 257/669; 257/689; 257/712; 257/733; 438/106; 438/123
(58) Field of Search .......................... 257/669, 686–689, 257/708, 712, 731–733, 739, 782, 787; 438/106, 117, 121–123

(56) References Cited

U.S. PATENT DOCUMENTS 3,860,949 A * 1/1975 Stoeckert et al. ........... 257/708
5,680,385 A * 10/1997 Nagano ................... 369/112.03

* cited by examiner

Primary Examiner—Minhloan Tran
Assistant Examiner—Leonardo Andújar
(74) Attorney, Agent, or Firm—James E. Eakin

(57) ABSTRACT

A method and structure for isolating a die from thermally induced or pressure induced differential stresses between a die and a package includes providing an intermediate layer having therein a plurality of relief channels arranged to provide a flexure for absorbing such differential stresses. The relief channels define interior and peripheral portions of the intermediate layer, and the die is typically mounted on the interior portion. The peripheral portion of the intermediate layer is then bonded to the package. The channels may be disposed along both the upper and lower surfaces of the intermediate layer, or may be disposed on only one surface. Likewise, the channels may be disposed along one or both of the length and width of the upper or lower surfaces. Reservoir channels may also be provided to prevent adhesive from flowing and bridging the relief channels. Other relief channel patterns may be implemented for other designs, including a checkboard pattern of relief channels on one side of an intermediate layer, to provide vertical stiffness and horizontal compliance.

5 Claims, 5 Drawing Sheets

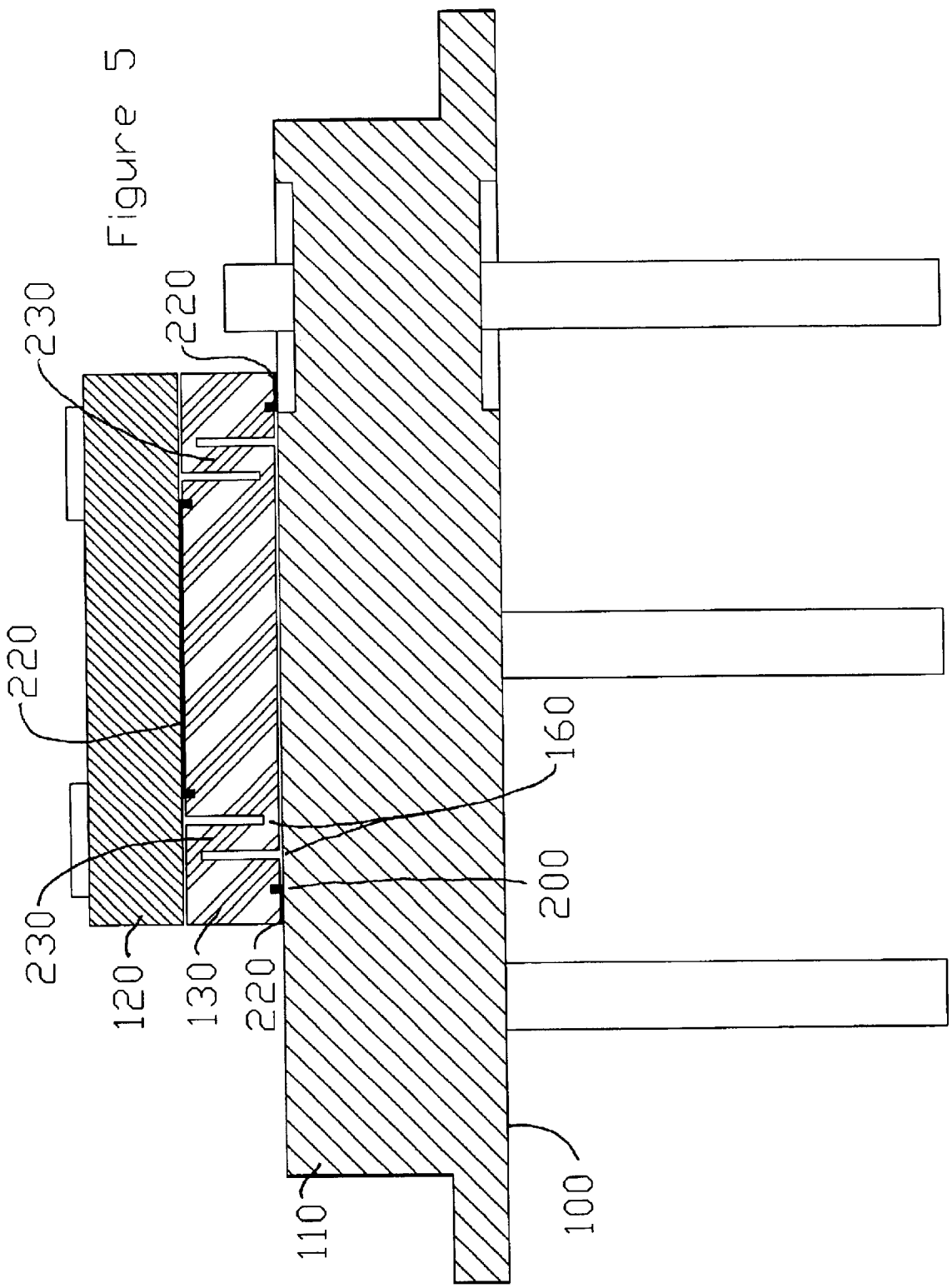

STRESS ISOLATING DIE ATTACH STRUCTURE AND METHOD

RELATED APPLICATIONS

The present invention is related to, claims the benefit of, and incorporates by reference provisional U.S. patent application Ser. No. 60/290,913, filed May 14, 2001.

FIELD OF THE INVENTION

The present invention relates to structures and techniques for attachment of a silicon die on a substrate, and more particularly relates to structures and techniques for reducing temperature- and pressure-induced stress on the die.

BACKGROUND OF THE INVENTION

To make a useful device of the electronic circuits fabricated onto silicon die, the die are usually packaged. For a variety of reasons, including cost, ease of fabrication, impact resistance, and so on, the package is not usually made out of silicon. Such packages are typically made of kovar or other metals and the silicon die is then rigidly bonded to that package. The portion of the package to which the die is bonded is sometimes referred to as the substrate or header.

The thermal coefficient of expansion for the silicon die is frequently very different than that for the header, which is usually much higher. This means that, when the temperature of the packaged die changes from that at which the die was bonded to the package, the dimensions of the package change more rapidly than the dimensions of the die and a thermal biomorph structure results. Stated more simply, the result is that the die is subjected to stress with a change in temperature, which can manifest either as warping or 'in place' stress. While this is not important for many types of electronic devices, such stress can adversely affect the performance of certain kinds of devices, including MEMS devices, accelerometers and pressure sensors. It has been observed that the most warping occurs when the silicon die and the package are of comparable thickness.

In the past, various techniques have been used to attempt to reduce thermally induced stress in such devices. One approach is to use a less rigid attachment of the die onto the substrate, such as by the use of silicone adhesives. This approach can result in greatly increased vibration and impact sensitivity, which is largely unacceptable in many applications. Another approach has been to bond the die onto a thick glass intermediate layer having a low expansion coefficient. The glass intermediate layer is then bonded to the header. In most instances, however, the glass is several times as thick as the silicon die or wafer, thus increasing the size of the package. In addition, while such glass intermediate layers increase the stiffness of the die, they do not appreciably reduce the bending moment applied to the glass-silicon bilayer.

Yet another approach has been to mount the die on a slotted metallic intermediate layer, such as described in U.S. Pat. No. 4,952,999. While this approach reduces the stress on the die, it does not increase the stiffness of the die, making it less effective than if both the stress was reduced and the stiffness increased.

Thus there has been a need for a structure which provided improved stress isolation as well as improved stiffness.

SUMMARY OF THE INVENTION

The present invention provides both increased die stiffness and materially improved stress isolation, without materially increased packaging size. In the present invention, the die is bonded to a silicon intermediate layer which has been relieved at specific points. The intermediate layer is then attached to the header at points which allow the relieved areas to absorb differential stresses, relative to the package, caused by thermal expansion. In particular, the die is typically bonded to the silicon intermediate layer essentially near the center of the die, and the silicon intermediate layer is then bonded to the header substantially at the perimeter of the intermediate layer. The relieved areas are typically intermediate the die attachment point(s) and the header attachment points, so that the relieved areas can flex to absorb any stresses induced by a change in dimensions of the package. While a silicon die and intermediate layer have been primarily described herein, it will be appreciated that the die and intermediate layer can be any semiconducting materials, with the intermediate layer being matched to the expansion index of the die.

In at least some embodiments, relief channels are cut into both the top and bottom of the wafer, and along both the length and the width thereof, with the result that the relief channels essentially form a rectangle around the die attachment area. As an additional feature, a second, more shallow series of channels may be cut interior of the relief channels to serve as reservoirs to prevent the adhesive used for bonding from flowing into the relief channels. Various patterns of channels may be used, depending on the particular device, and not every application will require relief channels on all sides of the die, just as not every application will require a rectangular shape to the channels. Likewise, not every application will require relief channels on the top and bottom of the die, although in general such an approach has been found more desirable.

The foregoing and other aspects of the invention may be better appreciated from the following Detailed Description of the Invention, taken together with the appended Figures.

THE FIGURES

FIG. 5 shows a cross-sectional side view of the assembly of FIG. 2.

DETAILED DESCRIPTION OF THE INVENTION

Figure 1:
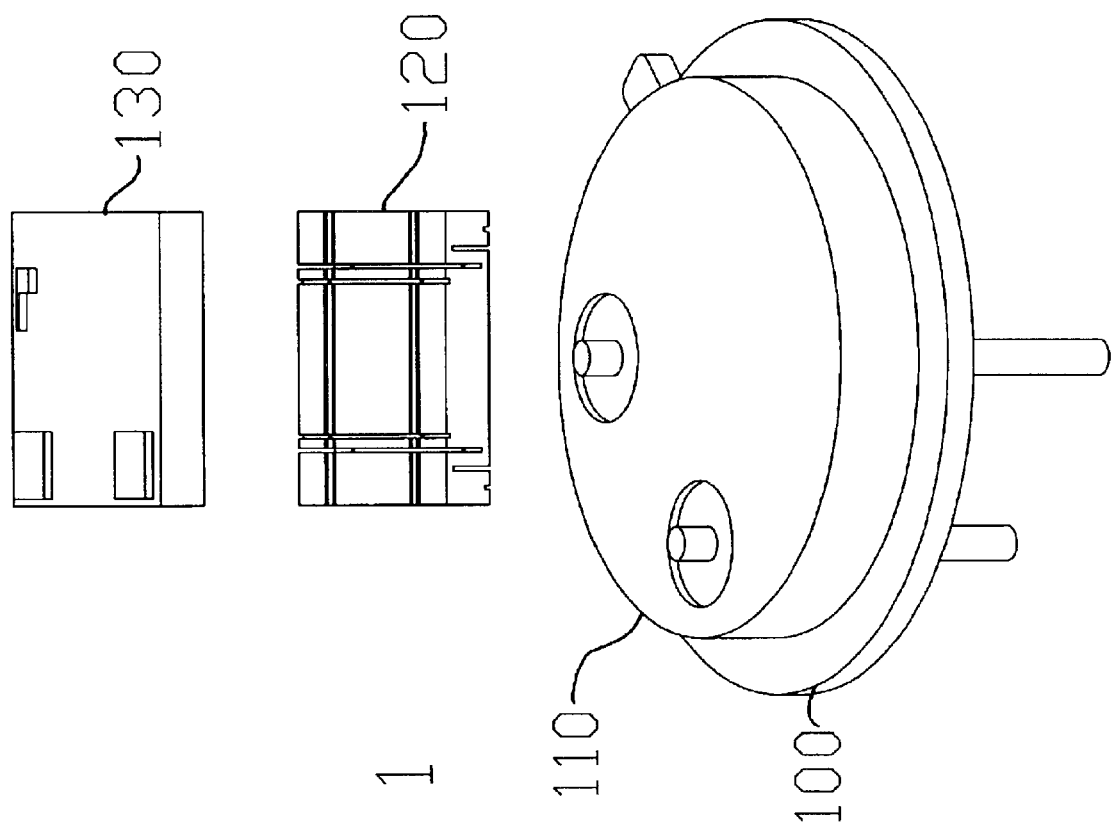
FIG. 1 shows in exploded view a die, an intermediate layer in accordance with the present invention, and a package.
Figure 2:
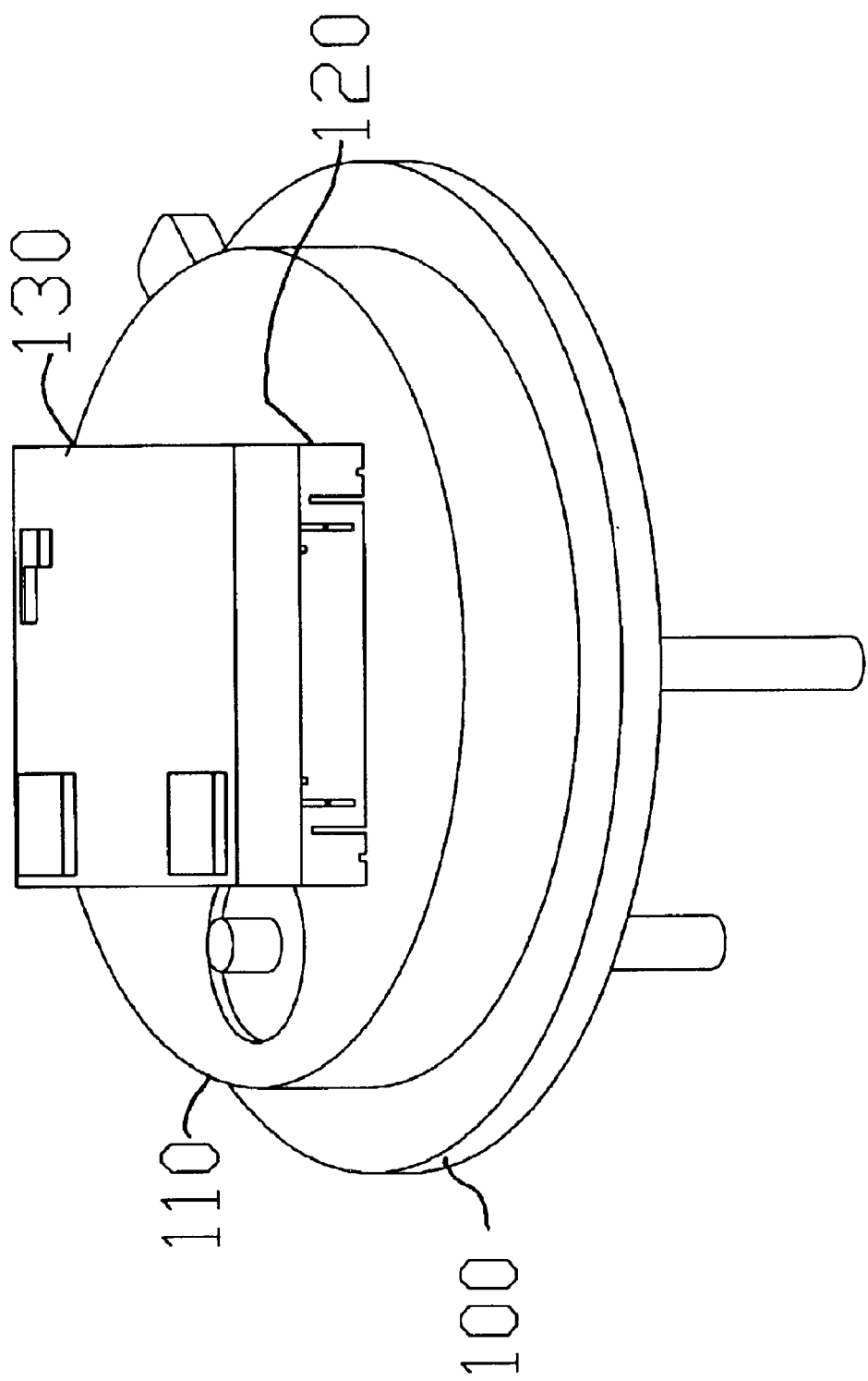
FIG. 2 shows in perspective view an assembled version of the die, intermediate layer, and package of FIG. 1.

Referring first to FIGS. 1 and 2, the general arrangement of the intermediate layer of the present invention relative to a semiconductor die and package can be better appreciated. A package 100, which may for example be a TO-39, is typically made of kovar or other suitable material and includes a header portion 110. A semiconductor die 120, typically comprised of silicon, gallium arsenide or other suitable material, is disposed above the header portion 110, and an intermediate layer 130 of the same material as the die is sandwiched between the header 110 and the die 120. Because the intermediate layer is constructed of the same material as the die, no thermal bimorph effect results.

In an exemplary arrangement, the die is rigidly affixed to the intermediate layer 130 at an interior portion 140 thereof, adding stiffness to the die 120. The intermediate layer 130 is also rigidly affixed to the header 110 at the outside periphery 150 of the intermediate layer, as discussed in greater detail hereinafter. Although the exemplary embodiment discussed herein comprises a die mounted on an intermediate layer, and the bottom of the intermediate layer mounted on the header, in the alternative an 'upside down' structure could be used. In one such an arrangement, a cavity exists in the header, and the intermediate layer is slightly larger than the die. The die is mounted on the intermediate layer, and arranged to extend down into the cavity in the header. The periphery of the intermediate layer then extends beyond the cavity, and is bonded to the header. It will be appreciated that this means that the same surface is used to bond to both the die and the header, in which case the reservoir channels may all be cut into the same side of the die. In some instances it is also permissible to cut the relief channels into the same side of the die.

Figure 3:
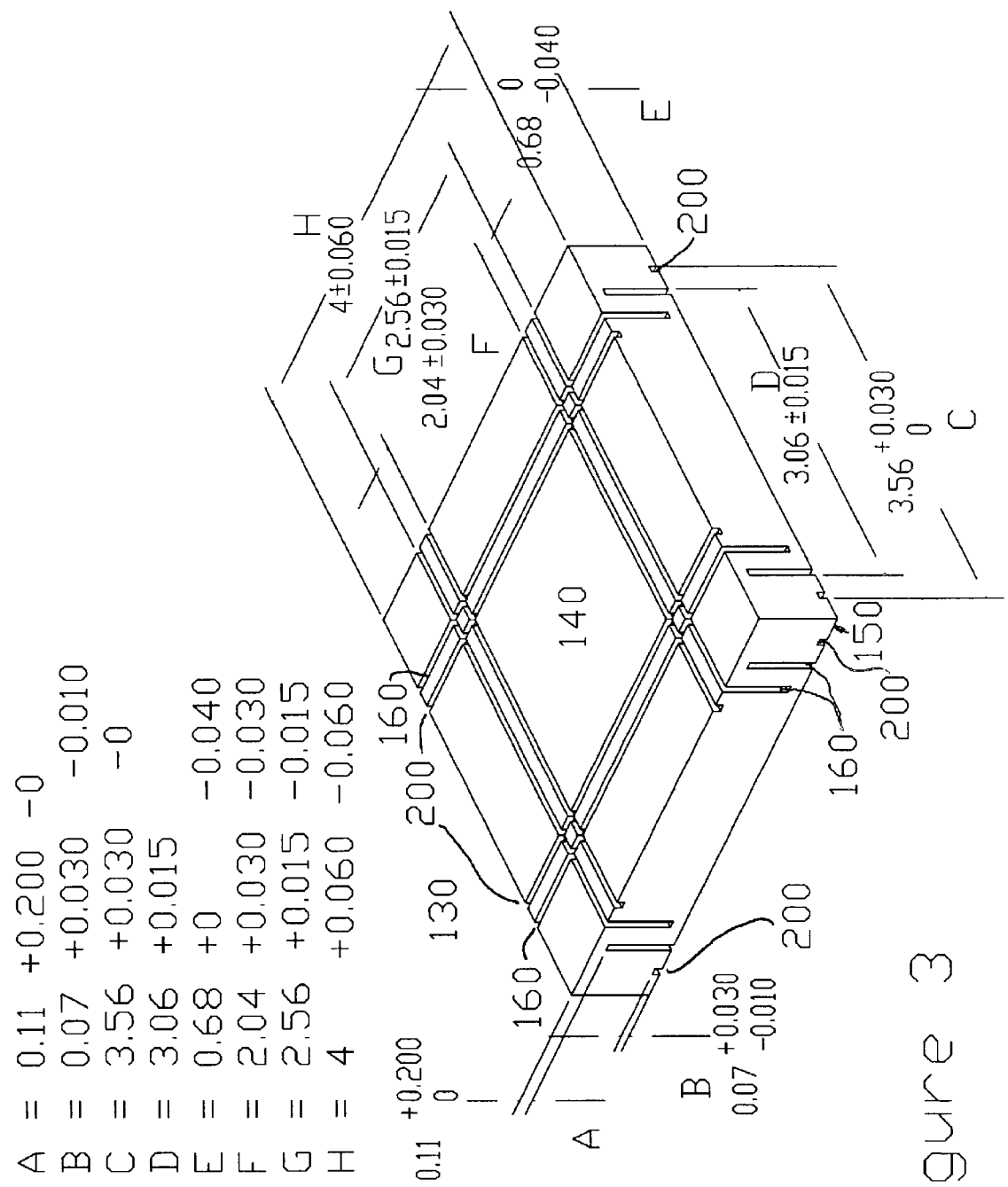
FIG. 3 shows a perspective view of the intermediate layer according to the present invention.
Figure 4:
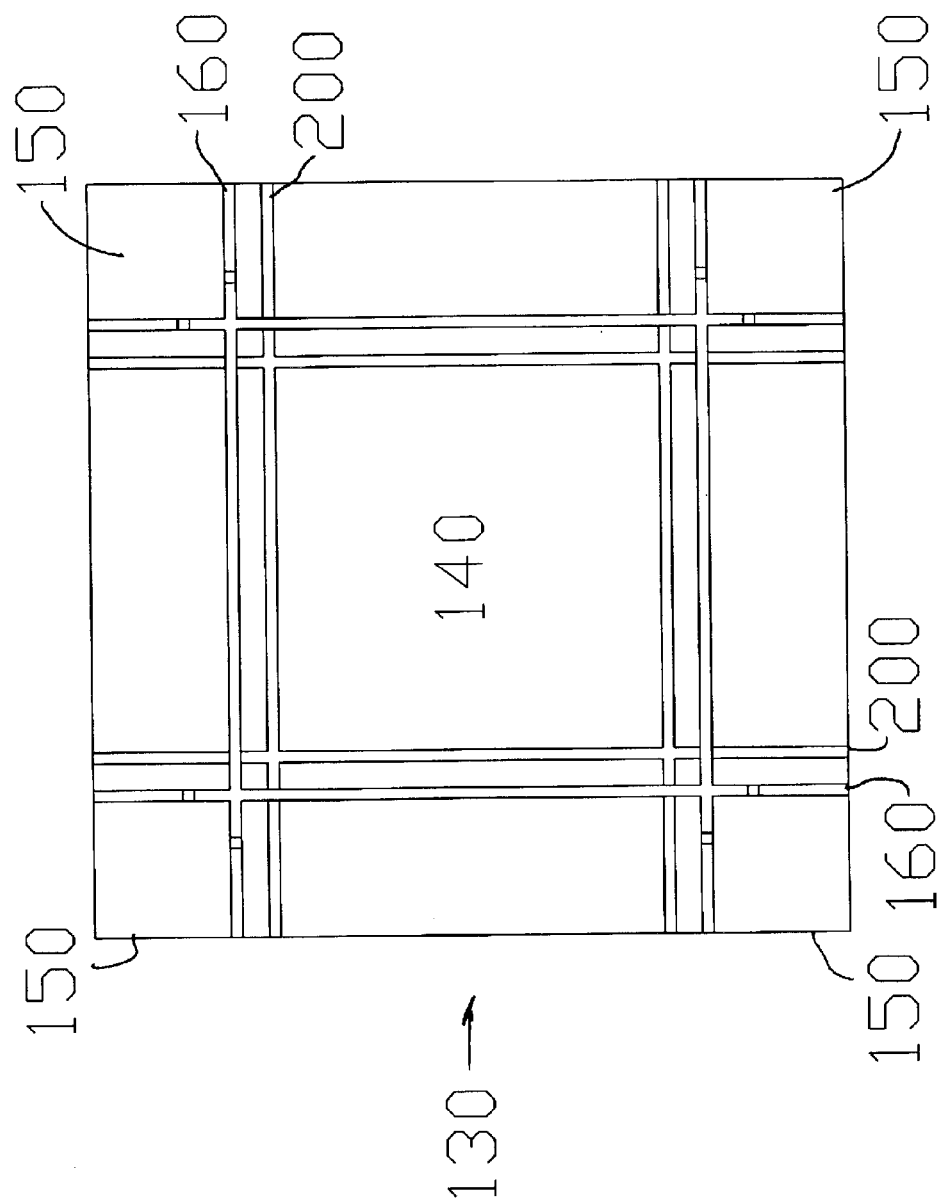
FIG. 4 shows a top plan view of the intermediate layer.

Referring next to FIGS. 3 and 4, the intermediate layer 130 of the present invention can be appreciated in greater detail. In an exemplary arrangement, the intermediate layer includes a plurality of relief channels 160, arranged one per side of the die on both the upper and lower surfaces. In one embodiment, the channels are on the order of 100–200 microns wide and extend the length of the 675 micron (4 mm) die, with a nominal channel width of one-hundred-fifty microns. The depth can vary, but in one embodiment is typically on the order of 0.57 millimeters for an intermediate layer having an overall thickness of 0.68 millimeters. The dimensions shown in FIG. 3 are for one exemplary embodiment, and provide an illustration of the range of tolerances for that example. Other die sizes may require different dimensions and tolerances. In general, good results have been achieved where the thickness of the intermediate layer is on the same order as the thickness of the die.

In some, though not necessarily all, embodiments a plurality of reservoir channels 200, which may be shallower than the relief channels 160 and serve as adhesive reservoirs, may be disposed on the interior side of the relief channels 160. The reservoir channels basically serve to prevent adhesive from flowing into the relief channels. By preventing the relief channels from being filled or otherwise bridged with adhesive, the relief channels can be better flex to absorb the differential stresses caused by dimensional changes in the package due to temperature. In many respects, the relief channels 160 can be seen to provide a spring-like expansion joint in the intermediate layer 130. This action can be better appreciated in connection with FIG. 5, discussed below.

Referring next to FIG. 5, the assembly of the die and intermediate layer can be seen bonded to the header 110 on the package 100. FIG. 5 illustrates a cross-sectional side view of the assembly of FIGS. 1 and 2, taken essentially through the centerline of the assembly. In particular, the die can be seen to be bonded to the central portion 140 of the intermediate layer 130 with a layer of adhesive 220. The intermediate layer, in turn, can be seen to be bonded to the header 110 at the periphery 150 of the intermediate layer 130. The relief channels 160 extending upward from the lower surface of the intermediate layer 130 can be seen to be outboard of the relief channels 160 extending downward from the upper surface of the intermediate layer 130, such that a ridge 230 of the die connects the interior portion 140 to the peripheral portion 150. In an exemplary arrangement, the nominal width of the ridge 230 may be on the order of 250 microns, although the particular spacing is at least in part driven by the space needed to attach the die to the intermediate layer and to bond the intermediate layer to the header.

Likewise in FIG. 5, the adhesive 220 can be seen to extend into one of the reservoir channels 200, such that the reservoir channel 200 protects the relief channel 160. As noted above, the reservoir channels are not required in many embodiments, although they do serve to provide additional protection to the relief channels.

The relief channels and reservoir channels (where used) are typically formed using a conventional dicing saw. To form the channels, a pattern is first placed on both sides of the wafer which will become the intermediate layer. The wafer is then relieved on one side by dicing part way through the wafer, with the relief pattern aligned to a mark on the first side of the wafer. The wafer is then turned over and relieved again and also diced into individual die-sized intermediate layers.

While one pattern of relief channels has been described, and has been shown to be particularly effective at relieving differential stresses caused by the different thermal or pressure-induced expansion coefficients of a package and a semiconductor die, various other patterns of relief channels are acceptable in other implementations. In particular, in some embodiments it is appropriate to use relief channels on one side only. In other embodiments, a checkerboard pattern may be formed on only one side of the intermediate layer to serve as vertically stiff, but horizontally compliant, legs. In still other embodiments it is desirable to use patterning in only one direction. As noted previously, the reservoir channels may not be included at all in some embodiments, or may be provided on only one surface of the intermediate layer. In addition, other means of attachment may be used, such as soldering after plating.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

What is claimed is:

1. A method for isolating a die from externally induced differential stresses between a package having a header and the die comprising the steps of providing an intermediate layer of substantially the same material as the die, relieving a plurality of channels where the relief channels define an interior portion of the intermediate layer and a peripheral portion of the intermediate layer and wherein the channels are relieved on an upper and a lower surface of the intermediate layer, attaching the die to the interior portion of the intermediate layer, and attaching the intermediate layer to the header at the peripheral portion of the intermediate layer.

2. The method of claim 1 wherein the channels are relieved inward of each of the intermediate layers.

3. A method for isolating a die from externally induced differential stresses between a package having a header and the die comprising the steps of providing an intermediate layer of substantially the same material as the die, relieving a plurality of channels wherein the relief channels define an interior portion of the intermediate layer and a peripheral portion of the intermediate layer and wherein channels are relieved on both an upper and a lower surface of the intermediate layer, attaching the die to the interior portion of the intermediate layer, and attaching the intermediate layer to the header at the peripheral portion of the intermediate layer.

4. A method for isolating a die from externally induced differential stresses between a package having a header and the die comprising the steps of providing an intermediate layer of substantially the same material as the die, wherein the intermediate layer has relief channels on an upper and a lower surface of the intermediate layer, the relief channels defining an interior portion of the intermediate layer and a peripheral portion of the intermediate layer, attaching the die to the one of the interior or peripheral portion of the intermediate layer, and attaching the intermediate layer to the header at the other of the interior or peripheral portion of the intermediate layer.

5. A semiconductor structure for isolating a die from externally induced differential stresses between the die and a package having a header comprising the die, and an intermediate layer of substantially the same material as the die and having a plurality of relief channels near the outside edges of the intermediate layer on an upper and a lower surface of the intermediate layer, the relief channels defining an interior portion of the interior portion of the intermediate layer and a peripheral portion of the intermediate layer wherein the peripheral portion of the intermediate layer is adapted to be mounted to the header, and a bonding agent for rigidly affixing the die to the interior portion of the intermediate layer.

* * * * *